(12) United States Patent
Lu

(10) Patent No.: US 8,584,351 B1
(45) Date of Patent: Nov. 19, 2013

(54) HANDLING APPARATUS FOR MOTHERBOARD

(75) Inventor: Wen-Hu Lu, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 0 days.

(21) Appl. No.: 13/568,205

(22) Filed: Aug. 7, 2012

(30) Foreign Application Priority Data

Jul. 23, 2012 (CN) .......................... 2012 1 0254581

(51) Int. Cl.
*B23P 19/00* (2006.01)
(52) U.S. Cl.
USPC .................. 29/739; 29/729; 29/764; 361/658
(58) Field of Classification Search
USPC ............. 29/729, 739, 764, 278; 361/685, 730
See application file for complete search history.

(56) References Cited

U.S. PATENT DOCUMENTS

| | | | | |
|---|---|---|---|---|
| 3,110,960 A | * | 11/1963 | Rondash | 29/278 |
| 3,867,753 A | * | 2/1975 | Urban et al. | 29/764 |
| 4,109,379 A | * | 8/1978 | Ratti et al. | 29/747 |
| 4,223,934 A | * | 9/1980 | Cauceglia et al. | 294/15 |
| 4,858,309 A | * | 8/1989 | Korsunsky et al. | 29/764 |
| 5,113,317 A | * | 5/1992 | Howe | 361/785 |
| 6,351,374 B1 | * | 2/2002 | Sherry | 361/679.33 |

* cited by examiner

*Primary Examiner* — Minh Trinh
(74) *Attorney, Agent, or Firm* — Altis & Wispro Law Group, Inc.

(57) ABSTRACT

A handing apparatus includes a handle, a tray configured to be secured to a motherboard, and a connecting rod. The connecting rod includes a clamping portion engaged with the tray. A first end of the connecting rod is rotatably secured to the handle by a first shaft, and a second end of the connecting rod is rotatably secured to the tray by a second shaft. The handle is rotatable about the first shaft relative to the connecting rod to disengage the clamping portion from the tray, so that the connecting rod is rotatable about the second shaft relative to the tray.

10 Claims, 7 Drawing Sheets

HANDLING APPARATUS FOR MOTHERBOARD

BACKGROUND

1. Technical Field

The present disclosure relates to handling apparatuses, more particularly to a handling apparatus for a motherboard.

2. Description of Related Art

A motherboard, secured to a server, often has a large size and a large weight. A handle is usually secured to the motherboard with screws for handling the motherboard. However, the handle is often located between a disk drive bracket and a plurality of memory cards, and it is inconvenient for securing or disassembling disk drives of the disk drive bracket and the plurality of memory cards. Therefore, there is room for improvement within the art.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
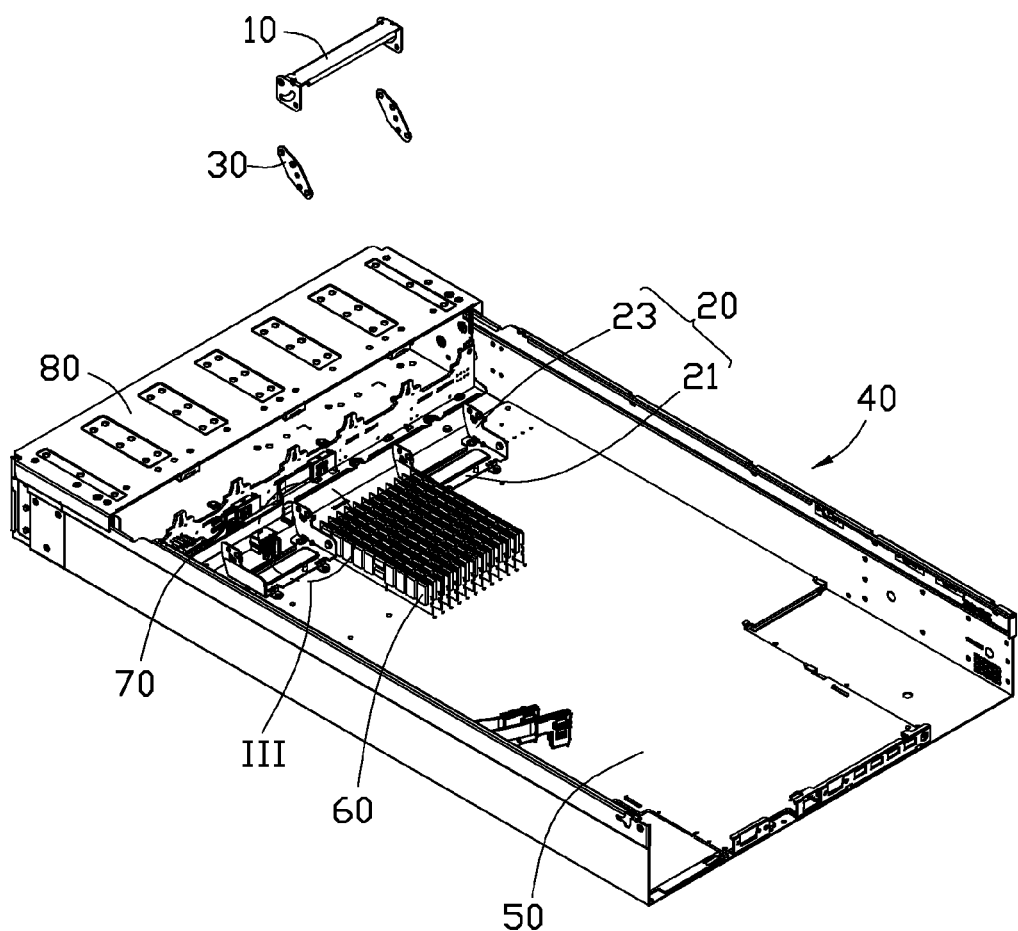
FIG. 1 is an exploded, isometric view of a handling apparatus in accordance with an embodiment.
Figure 2:
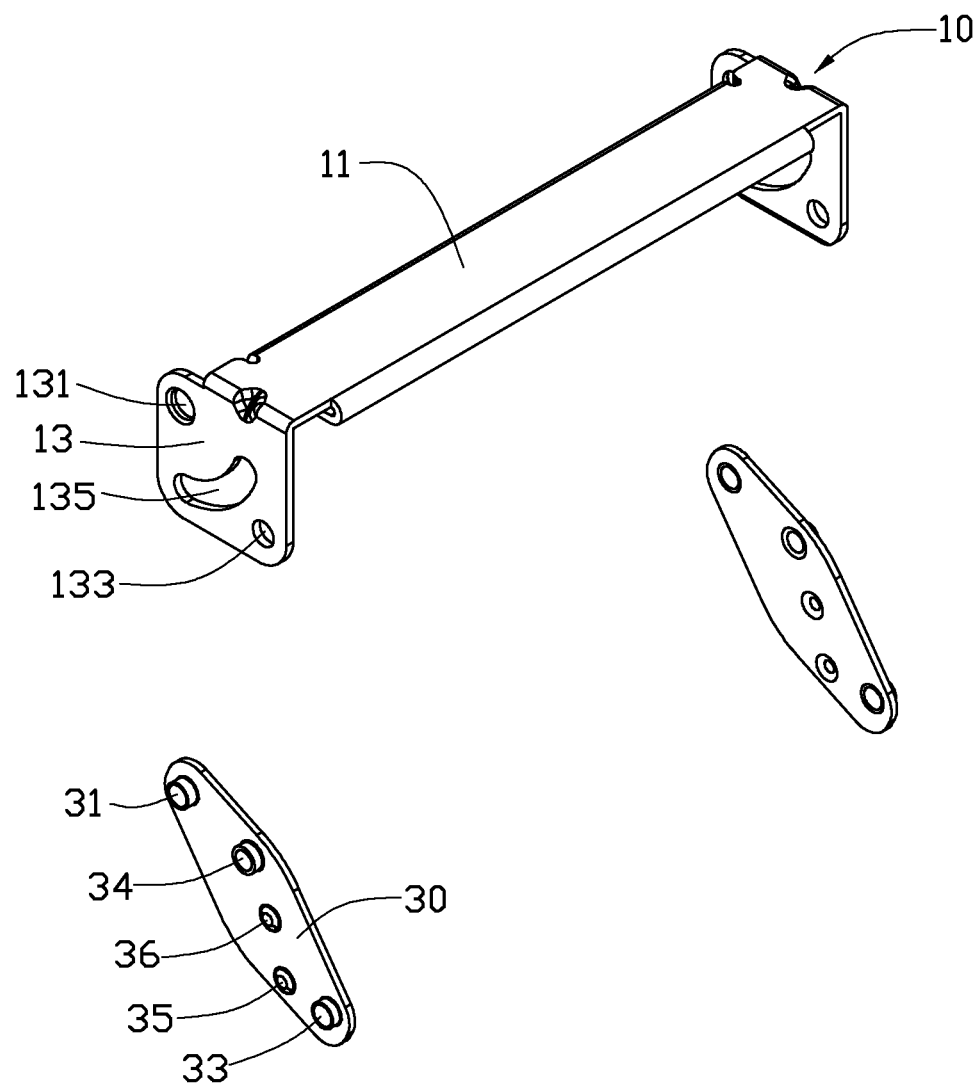
FIG. 2 is an exploded, isometric view of a handle and two connecting rods of the handling apparatus of FIG. 1.
Figure 3:
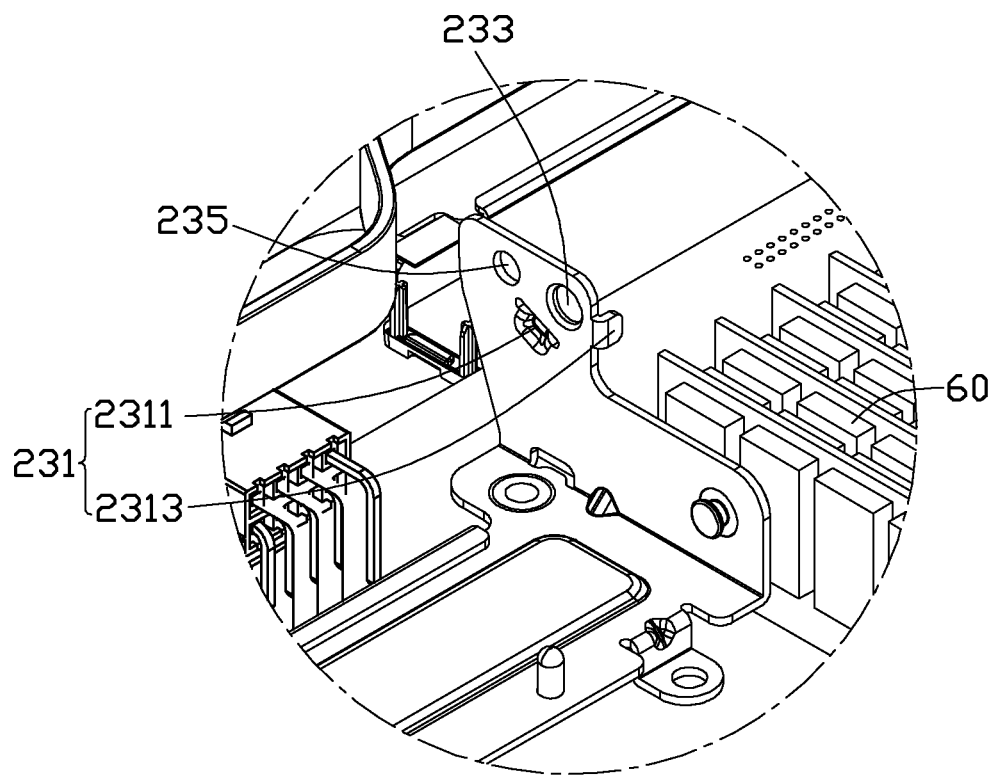
FIG. 3 is an enlarge view of a circled portion III of FIG. 1.
Figure 4:
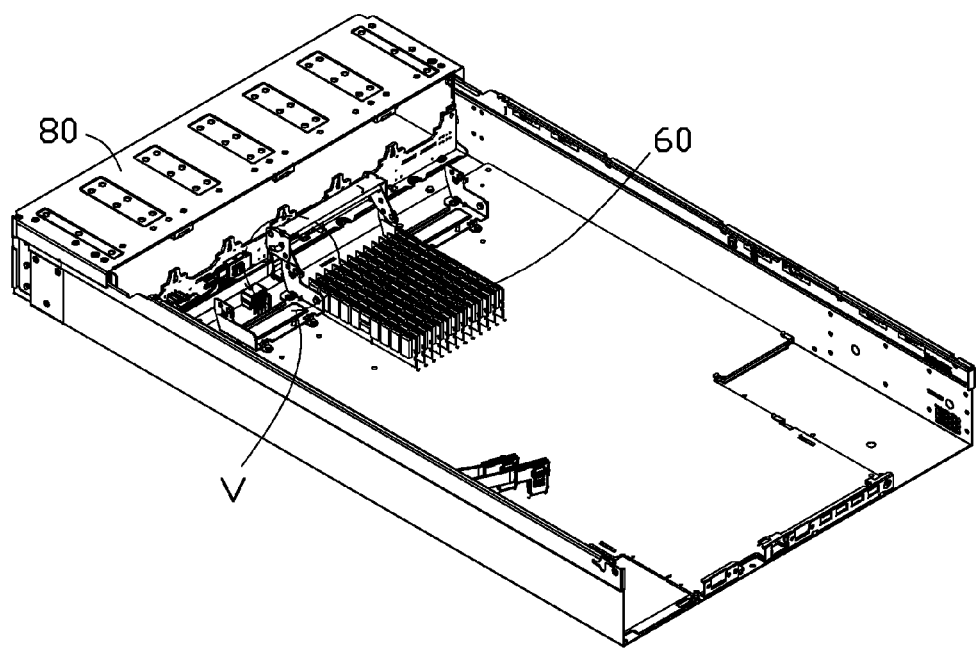
FIG. 4 is an assembled view of FIG. 1, and shows the handle in a first position.
Figure 5:
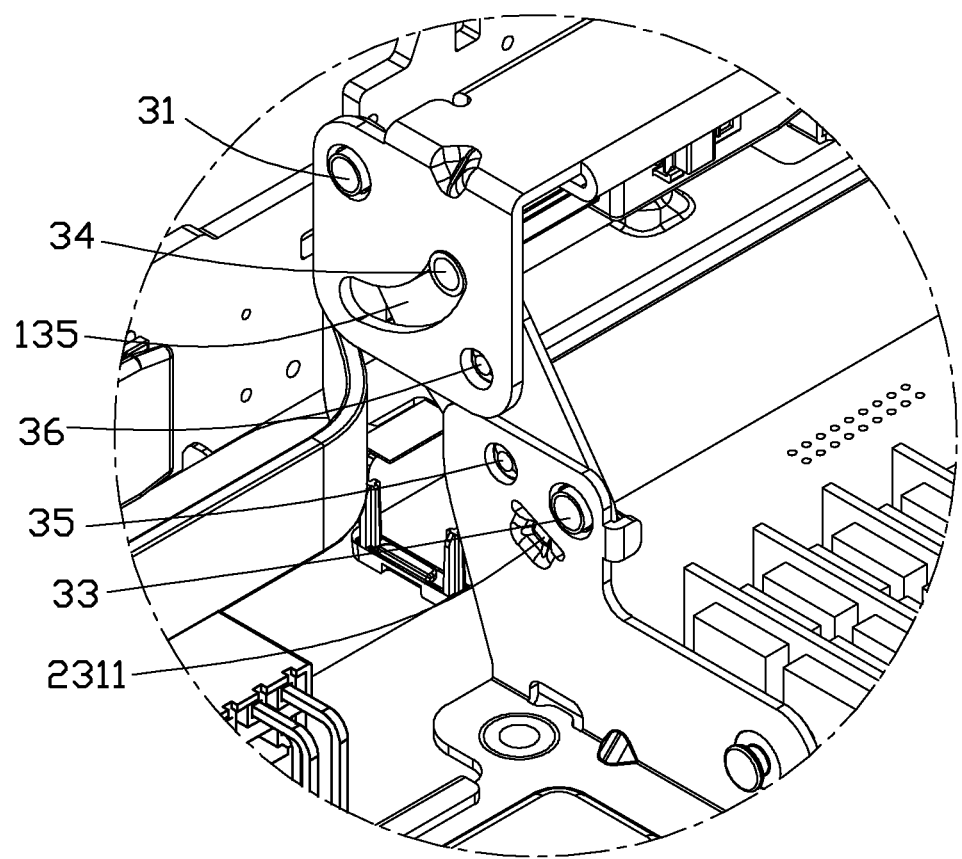
FIG. 5 is an enlarge view of a circled portion V of FIG. 4.
Figure 6:
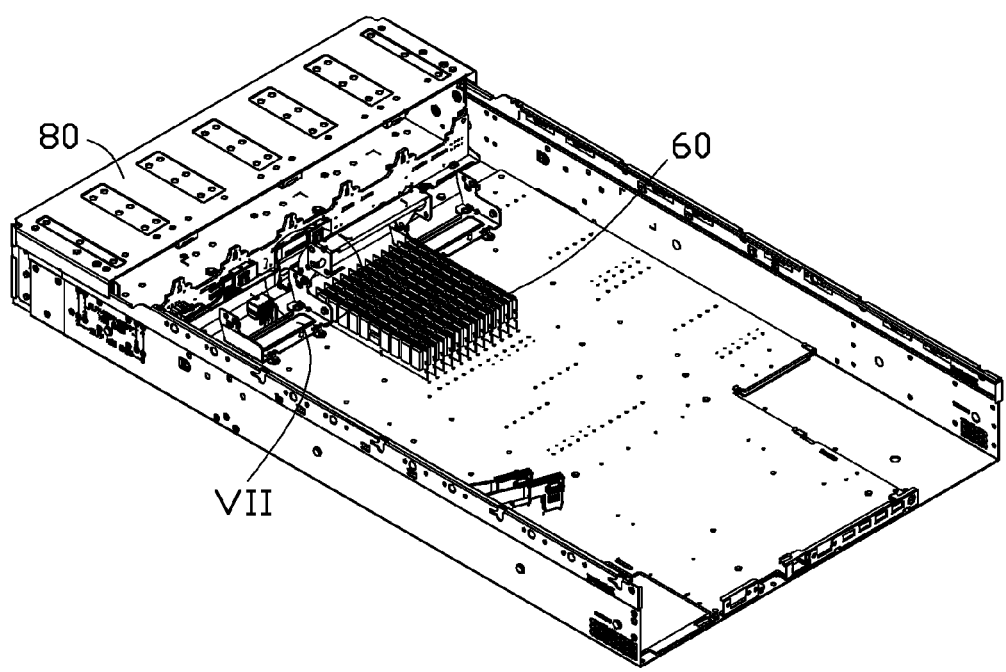
FIG. 6 is similar to FIG. 4, but shows the handle in a second position.
Figure 7:
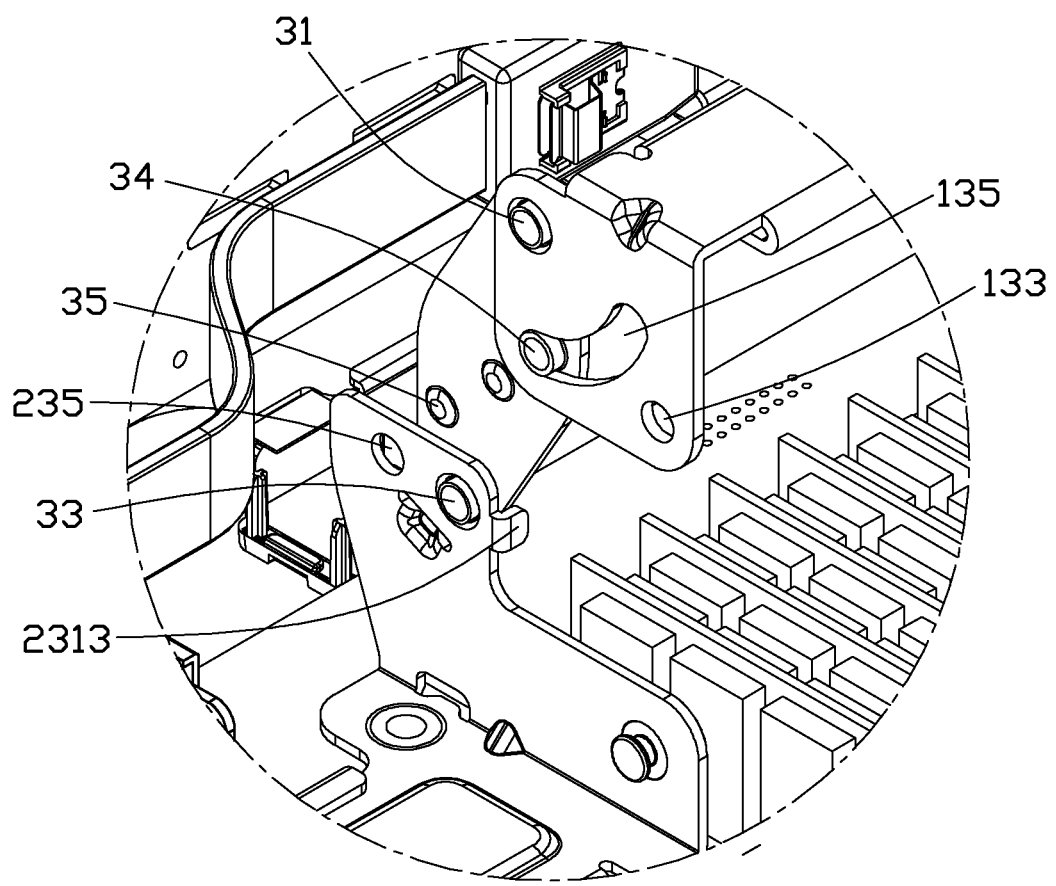
FIG. 7 is an enlarge view of a circled portion VII of FIG. 6.

FIGS. 1-3 illustrate a handling apparatus in accordance with an embodiment for handling a motherboard 50. The handling apparatus includes a handle 10, two trays 20, and two connecting rods 30 rotatably secured to the two ends of the handle 10 and the two trays 20. In one embodiment, the handling apparatus is secured to the motherboard 50 of a chassis 40, and each of the two trays 20 is a CPU tray.

The handle 10 includes a level panel 11 and two securing panels 13 extending from the level panel 11. In one embodiment, each of the two securing panels 13 is substantially perpendicular to the level panel 11. A first pivoting hole 131, a securing hole 133, and a sliding slot 135 are defined in each of the two securing panels 13. The sliding slot 135 is located between the first pivoting hole 131 and the securing hole 133. In one embodiment, the first pivoting hole 131 and the securing hole 133 are arranged on a diagonal line that is connected to two corners of each of the two securing panels 13, and the sliding slot 135 is substantially arcuate.

Each of the two trays 20 includes a supporting plate 21 and two mounting plates 23 extending from opposite edges of the supporting plate 21. In one embodiment, each of the two mounting plates 23 is substantially perpendicular to the supporting plate 21. Each of the two mounting plates 23 includes a blocking device 231. The blocking device 231 includes a first blocking portion 2311 and a second blocking portion 2313. The first blocking portion 2311 is defined in each of the two mounting plates 23, and the second blocking portion 2313 extends from an edge of each of the two mounting plates 23. A second pivoting hole 233 and a clipping hole 235 are defined in each of the two mounting plates 23 and above the first blocking portion 2311.

Each of the two connecting rods 30 includes a first shaft 31 and a second shaft 33. The first shaft 31 and the second shaft 33 are located on opposite ends of each of the two connecting rods 30. A sliding portion 34, a clamping portion 35, and a positioning portion 36 are defined in each of the two connecting rods 30. The sliding portion 34 is adjacent to the first shaft 31, the clamping portion 35 is adjacent to the second shaft 33, and the positioning portion 36 is located between the sliding portion 34 and the clamping portion 35.

A plurality of memory cards 60 are located between the two trays 20, and a cable 70 is connected to the motherboard 50 and adjacent to the plurality of memory cards 60. A bracket 80 is secured to the chassis 40 and adjacent to the cable 70.

FIGS. 4-7 illustrate an assembly of the handling apparatus in accordance with an embodiment. In assembly, the first shaft 31 is received in the first pivoting hole 131, and the second shaft 33 is received in the second pivoting hole 233. Simultaneously, the sliding portion 34 is received in a first end of the sliding slot 135, the clamping portion 35 is engaged in the clipping hole 235, and the positioning portion 36 is engaged in the securing hole 133. Therefore, the two connecting rods 30 are rotatably secured to the two trays 20 and the handle 10. At this point, the handle 10 is located in a first position (see FIGS. 4-5), the first blocking portion 2311 abuts each of the two connecting rods 30 for preventing each of the two connecting rods 30 from rotating relative to each of the two trays 20. The handle 10 is away from the plurality of memory cards 60, and the plurality of memory cards 60 can be easily secured to or removed from the motherboard 50.

The handle 10 is rotated about the first shaft 31 relative to the two connecting rods 30, the sliding portion 34 is slid in the sliding slot 135, until the positioning portion 36 is disengaged from the securing hole 133 and the clamping portion 35 is removed from the clipping hole 235. The handle 10 is further rotated to rotate the two connecting rods 30 about the second shaft 33 relative to the two trays 20, until the sliding portion 34 is located on a second end of the sliding slot 135 and the two connecting rods 30 are blocked by the second blocking portion 2313. At this point, the handle 10 is located in a second position (see FIGS. 6-7). The handle 10 is away from the cable 70, and the cable 70 can be easily secured to or removed from the motherboard 50.

When the handle 10 is rotated to the first position from the second position, the handle 10 is rotated about the first shaft 31 relative to the two connecting rods 30. The sliding portion 34 is slid in the sliding slot 135, until the positioning portion 36 is engaged in the securing hole 133. The handle 10 is further rotated, and the two connecting rods 30 are rotated about the second shaft 33 relative to the two trays 20. Until the clamping portion 35 is engaged in the clipping hole 235 and the sliding portion 34 is located in the first end of the sliding slot 135, the handle 10 is located in the first position.

It is to be understood, however, that even though numerous characteristics and advantages have been set forth in the foregoing description of embodiments, together with details of the structures and functions of the embodiments, the disclosure is illustrative only and changes may be made in detail, especially in matters of shape, size, and arrangement of parts within the principles of the disclosure to the full extent indicated by the broad general meaning of the terms in which the appended claims are expressed.

What is claimed is:

1. A handling apparatus comprising:
   a handle;
   a tray configured to be secured to a motherboard; and
   a connecting rod comprising a clamping portion engaged with the tray; a first end of the connecting rod being rotatably secured to the handle by a first shaft; and a second end of the connecting rod being rotatably secured to the tray by a second shaft;
   wherein the handle is rotatable about the first shaft relative to the connecting rod to disengage the clamping portion from the tray, so that the connecting rod is rotatable about the second shaft relative to the tray.

2. The handling apparatus of claim 1, wherein the handle defines a sliding slot, the connecting rod comprises a sliding portion engaged in the sliding slot, and the sliding portion is slidable in the sliding slot when the hand is rotated relative to the connecting rod.

3. The handling apparatus of claim 2, wherein the sliding slot is substantially arcuate.

4. The handling apparatus of claim 1, wherein the handle defines a securing hole, the connecting rod comprises a positioning portion engaged in the securing hole, and the handle is rotatable relative to the connecting rod to disengage the positioning portion from the securing hole.

5. The handling apparatus of claim 1, wherein the tray comprises a blocking device, and the blocking device abuts the connecting rod for preventing the connecting rod from rotating relative to the tray.

6. The handling apparatus of claim 5, wherein the blocking device comprises a first blocking portion and a second blocking portion, the first blocking portion abuts the connecting rod when the clamping portion is engaged with the tray, and the second blocking portion abuts the connecting rod when the clamping portion is disengaged from the tray.

7. The handling apparatus of claim 6, wherein the tray comprises a mounting plate, the first blocking portion is located on the mounting plate and towards the connecting rod, and the second blocking portion extends from an edge of the mounting plate.

8. The handling apparatus of claim 1, wherein the tray defines a clipping hole, and the clamping portion is engaged in the clipping hole.

9. The handling apparatus of claim 1, wherein a configuration of the first shaft is same as a configuration of the second shaft, and the first shaft and the second shaft are located on opposite ends of the connecting rod.

10. The handling apparatus of claim 1, wherein the tray is a CPU tray.

* * * * *